(12) United States Patent
Gandhi

(10) Patent No.: US 6,941,525 B2
(45) Date of Patent: Sep. 6, 2005

(54) LEAKAGE CURRENT REDUCTION IN STANDARD CELLS

(75) Inventor: Dhrumil Gandhi, Cupertino, CA (US)

(73) Assignee: Artisan Components, Inc., Sunnyvale, CA (US)

(*) Notice: Subject to any disclaimer, the term of this patent is extended or adjusted under 35 U.S.C. 154(b) by 104 days.

(21) Appl. No.: 10/448,636

(22) Filed: May 29, 2003

(65) Prior Publication Data

US 2004/0243946 A1 Dec. 2, 2004

(51) Int. Cl.⁷ .............................................. G06F 17/50
(52) U.S. Cl. .................................................. 716/1; 716/5
(58) Field of Search ............................... 716/1, 2, 4–6; 326/21, 26; 257/285, 500; 365/95

(56) References Cited

U.S. PATENT DOCUMENTS

| | | | |
|---|---|---|---|
| 6,064,223 A * | 5/2000 | Lu et al. ......................... | 326/21 |
| 6,586,963 B2 * | 7/2003 | Choi et al. ...................... | 326/26 |
| 6,734,521 B2 * | 5/2004 | Houston ......................... | 257/500 |
| 6,745,371 B2 * | 6/2004 | Konstadinidis et al. ........ | 716/2 |
| 2003/0183856 A1 * | 10/2003 | Wieczorek et al. ............. | 257/285 |
| 2004/0125637 A1 * | 7/2004 | Singhal ........................... | 365/95 |

* cited by examiner

Primary Examiner—Vuthe Siek
(74) Attorney, Agent, or Firm—Martine Penilla & Gencarella, LLP

(57) ABSTRACT

A method for reducing leakage currents in integrated circuits and the integrated circuits with reduced leakage currents that result from this method are disclosed. The present invention determines which transistors in a standard logic cell (also known as a standard cell) are not critical with respect to the ultimate speed of operation of the standard logic cell. After determining which transistors do not critically impact the speed of the standard logic cell's operation, these designated transistors are designed with either lengthened channels or their channels are implanted. Both circuit design techniques will increase the threshold voltage ($V_T$) of the transistors and thereby reduce their leakage current. Standard cells with high $V_T$ transistors in their non-critical circuit pathways exhibit reduced leakage currents when compared with known logic cells.

11 Claims, 3 Drawing Sheets

LEAKAGE CURRENT REDUCTION IN STANDARD CELLS

BACKGROUND OF THE INVENTION

1. Field of the Invention

This invention relates generally to the design and fabrication of integrated circuits. More specifically, it relates to methods and apparatus for reducing leakage currents in integrated circuits, the integrated circuits being at least partially comprised of standard logic cells.

2. Description of the Related Art

In known integrated circuits (ICs), leakage currents have become a significant waste of power. As IC operating voltage has dropped, the threshold voltage ($V_T$) required to turn on the transistors in the IC has also dropped. At this lower $V_T$ transistors do not turn on and off in a "hard" manner and increasingly large amounts of current flow through the transistors even when the transistors are nominally off. This current is known as leakage current and currently comprises a significant source of power wastage in ICs.

With ever diminishing transistor size, the effects of these leakage currents have increased. Each new process generation experiences roughly a 5–10× increase in leakage currents through the transistors. At current 0.13 $\mu$m to 90 nanometer (nm) transistor size, the problem has become increasingly urgent. At these reduced transistor sizes and decreased $V_T$, leakage currents use an increasing proportion of the total power consumed by the IC. Additionally, the heat generated by the leakage currents is undesirable and the leakage currents themselves may affect the reliability of the IC.

It is currently known that a transistor's leakage current can be reduced by modifying its electrical properties. Two known ways to accomplish this are increasing the transistor's channel length or doping the transistor's channel, increasing its $V_T$. Both methods share the same drawback, which is that a transistor so modified operates more slowly than an unmodified transistor.

One way to mitigate this disadvantage is to use these low leakage, but slow operating transistors strategically at the cell or block level so that the slower transistors impact the performance of the completed IC only minimally. These "strategically placed" transistors would be modified in some way during layout to incorporate either high $V_T$ doping or larger channel lengths, or both to reduce their leakage currents.

In some standard logic cell libraries, two sets of standard logic cells are created, the first operating at a higher speed with greater leakage currents and the second set operating at a slower speed but with reduced leakage currents, the reduced leakage currents effected by doping the transistors' channels in a known manner. A designer can then choose various combinations of cells from both sets to obtain the required performance and minimum leakage current in the final circuit design. This approach reduces the total chip level leakage current whenever a reduced leakage cell is used in the place of high performance, high leakage cell. However, many transistors in a high performance cell can be replaced with lower leakage transistors without reducing the performance of the overall design, since multiple signal paths exist in most logic cells, and normally only one of these paths determines the overall chip level performance. The present solution of using combinations of high performance and low leakage cells leaves a number of high leakage transistors as part of the high performance cells that could safely be replaced by low leakage transistors.

A method to allow chip level designer to create a design that achieves target timing performance and also further reduces leakage current by maximizing the number of low leakage transistors used would therefore be desirable.

SUMMARY OF THE INVENTION

The present invention in its first preferred embodiment describes a method and apparatus for reducing the leakage currents in standard logic cells by selecting non-critical circuit pathways through the standard logic cells and then either increasing the transistor channel lengths or implanting the transistor channel gates of these non-critical transistors to increase their $V_T$, the transistor's threshold voltage. In this context, non-critical does not mean that the particular circuit pathway is not important to the functionality of the standard logic cell. Instead, non-critical means that the circuit pathway selected operates sufficiently slower than at least one other circuit pathway through the standard logic cell that the additional performance impact of altering its transistors in the noted fashion impacts the operational speed of the standard logic cell very minimally on a global level. By selecting the proper circuit pathways within the standard cells and applying these techniques to these selected circuit pathways, whatever negative performance impact these modification occasion will be without noticeable effect on the operation on the standard cell and will simultaneously reduce leakage currents in the standard cells significantly. These and other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
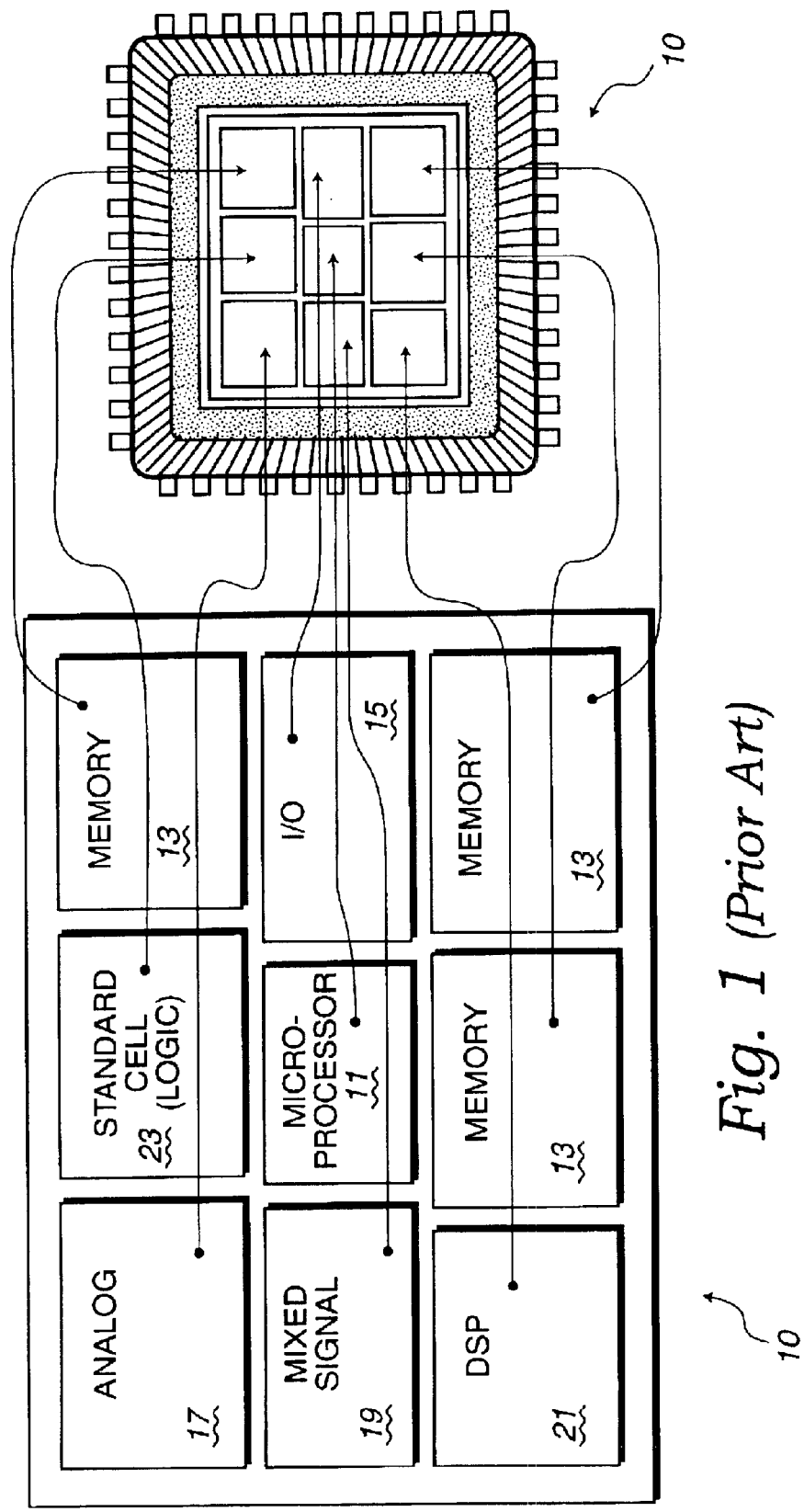
FIG. 1 illustrates a known integrated circuit having a plurality of standard cells (Prior Art)

As shown in FIG. 1, integrated circuit 10 is comprised of several functional areas: processor section 11, memory sections 13, input/output section 15, analog signal section 17, mixed signal section 19, digital signal processor (DSP) 21 and a logic function section 23. In turn, logic function 23 is comprised of a plurality of standard logic cells, coupled together to fulfill required logic functions. The selection and interconnection of standard logic cells to fulfill larger logic circuit functions is well known in this field and requires no further description here.

Figure 2:
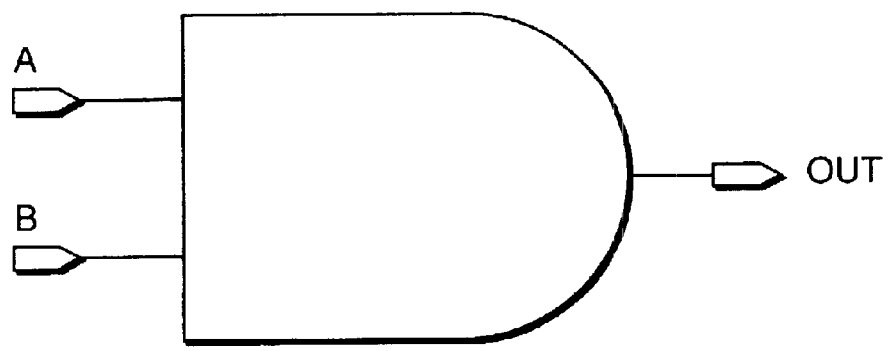
FIG. 2 is a detail of a single known standard cell (Prior Art)

FIG. 2 illustrates a known standard logic cell, in this case a two input AND gate 21. A schematic of AND gate 21 is provided in FIG. 3, with the different logic pathways through the cell shown as traces 23 and 25. Traces 23 and 25 show at least two different pathways through AND gate 21. As a general rule, the pathway through the cell that traverses the fewest transistors will generally be the fastest pathway and determines the fastest operating performance of the standard logic cell. In this example, trace 23 is faster than trace 25.

Figure 3:
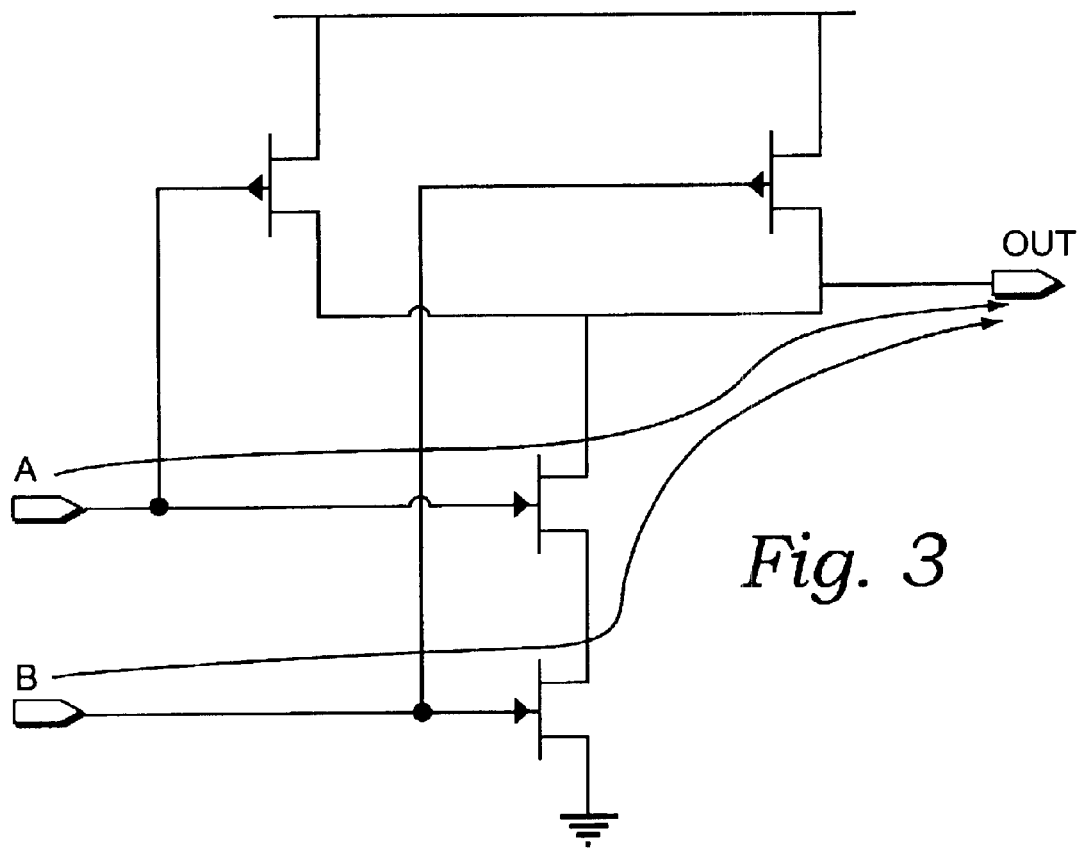
FIG. 3 is a schematic of a single NAND logic gate, with circuit paths through the cell labeled.

AND gate 21 of FIGS. 2 and 3 is only one example. There are many other standard logic cells and the number of pathways through each cell varies with the complexity of the logic function that the cell performs. It remains true despite increasing standard cell complexity that one pathway through the standard cell that is significantly faster than the others and that this pathway largely determines the standard cell's operating performance.

Figure 4:
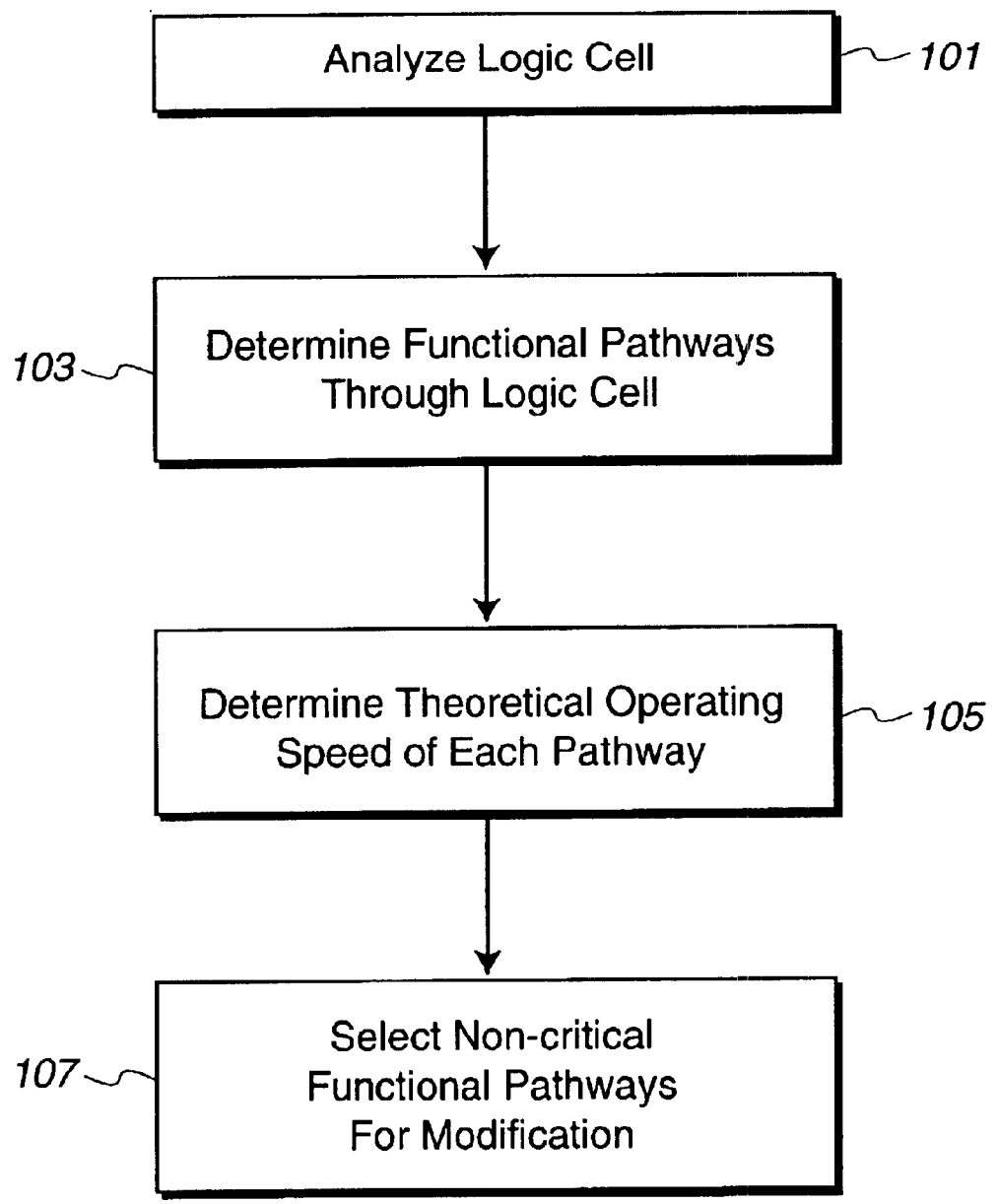
FIG. 4 is a flow chart detailing the method the present invention uses to reduce leakage currents in standard cells.

The method whereby the present invention reduces leakage currents in standardcells is illustrated by the flow chart in FIG. 4. At step 101, the proposed standard logic cell design is analyzed by the logic cell circuit designer. At step 103, the circuit designer determines each of the functional pathways through the standard logic cell. At step 105, the circuit designer further determines the theoretical operating speed of each of the functional pathways. Finally, at step 107, the functional pathways whose operating speed is slower than the operating speed of the fastest functional pathways are selected. The leakage current of the transistors in these slower functional pathways is reduced, either by lengthening their channels by anywhere from 2% to 100%, or by doping their channels to increase the threshold voltage $V_T$ by 2% to 100%. The leakage reduction corresponds to the % change in either parameter.

These logic cells are used as the basic building blocks by the chip designers with the help of circuit synthesis tools. There are many circuit synthesis tools that exist to facilitate the design and operation of electronic circuits, in particular logic circuits. These tools are capable of understanding the timing behavior of logic cells in terms of the different pathways, and selecting the higher level implementation such that the fastest pathway through each logic cell is used in the chip level timing critical path. The slower pathways are assigned to signal paths that are not critical to the overall design performance.

This method will reduce the leakage currents in standard logic cells without simultaneously reducing the overall chip level performance. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for reducing leakage currents in a standard logic cell, the method comprising the steps of:

determining function pathways through the standard logic cell;

determining an operating speed for each of the functional pathways through the standard logic cell; and reducing the leakage current of transistors in the functional pathways whose operating speeds are slower than the operating speed of the fastest functional pathway.

2. The method of claim 1 wherein the leakage current of the transistors in the functional pathways slower than the fastest functional pathways is reduced by increasing the channel length of the transistors.

3. The method of claim 1 wherein the leakage current of the transistors in the functional pathways slower than the fastest functional pathways is reduced by doping the channel of the transistors.

4. A standard logic cell with reduced leakage current, the standard logic cell comprising:

a first plurality of active devices defining a first functional pathway through the standard logic cell, the first plurality of active devices have unmodified channels and operating at a first predefined speed; and a second plurality of active devices defining a plurality of secondary functional pathways through the standard logic cell, the second plurality of active devices having modified channels and operating at a second predefined speed, the second predefined speed being slower than the first predefined speed.

5. The standard logic cell with reduced leakage current of claim 4 wherein the active devices comprise transistors.

6. The standard logic cell with reduced leakage current of claim 4 wherein the second plurality of active devices have channels doped to reduce their leakage currents.

7. The standard logic cell with reduced leakage current of claim 4 wherein the second plurality of active devices have channels lengthened to reduce their leakage currents.

8. A method for designing logic cells, the method comprising the steps of:

using an electronic design program to describe a logic cell performing a first logic function, the logic cell comprising at least a plurality of active devices;

using the electronic design program to determine functional pathways through the logic cell and to calculate the operating speed of each functional pathway;

selecting a first pathway with the fastest operating speed; and modifying the active devices that form all functional pathways other than the first pathway to reduce their leakage current.

9. The method of claim 8 wherein the active devices are modified by increasing their channel lengths.

10. The method of claim 9 wherein the active devices are modified by doping their channels.

11. Logic cells having reduced leakage currents, the logic cells comprising a plurality of active devices, the active devices defining a plurality of functional pathways through the logic cell, the logic cells having a first functional pathway that operates faster than the remaining plurality of functional pathways, the active devices which comprise the remaining plurality of functional pathways being modified to reduce their leakage currents.

* * * * *